(12) United States Patent
Liu et al.

(10) Patent No.: US 7,851,384 B2
(45) Date of Patent: Dec. 14, 2010

(54) METHOD TO MITIGATE IMPACT OF UV AND E-BEAM EXPOSURE ON SEMICONDUCTOR DEVICE FILM PROPERTIES BY USE OF A BILAYER FILM

(75) Inventors: Yijun Liu, Sunnyvale, CA (US);
Huiwen Xu, Sunnyvale, CA (US);
Li-Qun Xia, Santa Clara, CA (US);
Chad Peterson, San Jose, CA (US);
Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 657 days.

(21) Appl. No.: 11/751,516

(22) Filed: May 21, 2007

(65) Prior Publication Data

US 2007/0281497 A1    Dec. 6, 2007

Related U.S. Application Data

(60) Provisional application No. 60/809,943, filed on Jun. 1, 2006.

(51) Int. Cl.
*H01L 21/31*    (2006.01)
*H01L 21/469*   (2006.01)

(52) U.S. Cl. ............... 438/778; 438/780; 257/E21.256; 257/E21.257

(58) Field of Classification Search ............... 438/780, 438/779; 257/E21.256, E21.257
See application file for complete search history.

(56) References Cited

U.S. PATENT DOCUMENTS

| 5,003,178 | A | 3/1991 | Livesay |
| 6,054,379 | A | 4/2000 | Yau et al. |
| 6,287,990 | B1 | 9/2001 | Cheung et al. |
| 6,303,523 | B2 | 10/2001 | Cheung et al. |
| 6,582,777 | B1 | 6/2003 | Ross et al. |
| 6,790,788 | B2 | 9/2004 | Li et al. |
| 7,060,330 | B2 | 6/2006 | Zheng et al. |
| 7,091,137 | B2 | 8/2006 | Lee et al. |
| 2003/0186168 | A1* | 10/2003 | Gallagher et al. ........... 430/296 |
| 2003/0194495 | A1 | 10/2003 | Li et al. |
| 2004/0067308 | A1 | 4/2004 | Zheng et al. |
| 2005/0250346 | A1 | 11/2005 | Schmitt |

* cited by examiner

*Primary Examiner*—Matthew C Landau
*Assistant Examiner*—Sonya D McCall-Shepard
(74) *Attorney, Agent, or Firm*—Patterson & Sheridan, LLP (57) ABSTRACT

Methods are provided for processing a substrate comprising a bilayer barrier film thereon. In one aspect, a method comprises depositing a first barrier layer, depositing a second barrier layer on the first barrier layer, depositing a dielectric layer on the bilayer barrier film formed by the first barrier layer and the second barrier layer, and ultraviolet curing the dielectric layer. In another aspect, a method comprises depositing a first barrier layer, depositing a second barrier layer on the first barrier layer, depositing a dielectric layer on the bilayer barrier film formed by the first barrier layer and the second barrier layer, and curing the dielectric layer with an electron beam treatment.

11 Claims, 3 Drawing Sheets

METHOD TO MITIGATE IMPACT OF UV AND E-BEAM EXPOSURE ON SEMICONDUCTOR DEVICE FILM PROPERTIES BY USE OF A BILAYER FILM

CROSS-REFERENCE TO RELATED APPLICATIONS

This application claims benefit of U.S. Provisional Patent Application Ser. No. 60/809,943, filed Jun. 1, 2006, which is herein incorporated by reference.

BACKGROUND OF THE INVENTION

1. Field of the Invention

Embodiments of the invention relate to the improvement of semiconductor device fabrication, more specifically to a method of improving mechanical integrity of a device by forming dielectric barrier films on a substrate 2. Description of the Related Art Semiconductor device geometries have dramatically decreased in size since such devices were first introduced several years ago. Since then, integrated circuits have generally followed the two year/half-size rule (often called Moore's Law), which means that the number of devices that will fit on a chip doubles every two years. Today's fabrication plants are routinely producing devices having 90 nm feature sizes, and tomorrow's plants soon will be producing devices having even smaller geometries.

To further reduce the size of devices on integrated circuits, it has become necessary to use conductive materials having low resistivity and to use insulators having low dielectric constants (dielectric constant, k, of less than 4.0) to also reduce the capacitive coupling between adjacent metal lines. One such low k material is carbon doped silicon oxide that is deposited by a chemical vapor deposition process and may be used as a dielectric material in fabricating damascene features.

One conductive material having a low resistivity is copper and its alloys, which have become the materials of choice for sub-quarter-micron interconnect technology because copper has a lower resistivity than aluminum, a higher current, and higher carrying capacity. These characteristics are important for supporting the higher current densities experienced at high levels of integration and increased device speed. Further, copper has a good thermal conductivity and is available in a highly pure state.

One difficulty in using copper in semiconductor devices is that copper is difficult to etch and achieve a precise pattern. Etching with copper using traditional deposition/etch processes for forming interconnects has been less than satisfactory. Therefore, new methods of manufacturing interconnects having copper containing materials and low k dielectric materials are being developed.

One method for forming vertical and horizontal interconnects is by a damascene or dual damascene method. In the damascene method, one or more dielectric materials, such as the low k dielectric materials, are deposited and pattern etched to form the vertical interconnects, for example, vias, and horizontal interconnects, for example, lines. Conductive materials, such as copper containing materials, and other materials, such as barrier layer materials used to prevent diffusion of copper containing materials into the surrounding low k dielectric, are then inlaid into the etched pattern. Any excess copper containing materials and excess barrier layer material external to the etched pattern, such as on the field of the substrate, is then removed.

Low dielectric constant (low k) films are used to improve interconnect RC delay, power dissipation, and crosstalk noise by reducing capacitance between interconnect metal lines. However, low k materials are often porous and susceptible to interlayer diffusion of conductive materials, such as copper, which can result in the formation of short-circuits and device failure. Dielectric barrier films are used to prevent copper diffusion into low k dielectric films and serve as an etch stop layer.

Several thermal curing methods have been established to further reduce the dielectric constant of deposited low k films. The methods for reducing the dielectric constants of the films should at least maintain or not degrade the physical properties of the films, while improving their electrical properties, such by reducing the presence of unwanted electrical charges within the material lattice and enhancing their performance as insulators. However, current thermal curing methods have proven unsatisfactory for curing films while retaining the desired physical properties of film stacks that include the low k films and barrier films as layers of the stacks.

Therefore, there remains a need for a method for depositing and curing dielectric layers while retaining the desired physical properties of film stacks that include the dielectric layers.

SUMMARY OF THE INVENTION

Embodiments of the invention generally provide a method for preventing the transmittance of ultraviolet radiation to underlying inter-level dielectric layers and preventing changes in the film stack stress of film stacks that are exposed to ultraviolet radiation. The embodiments include depositing dielectric barrier films.

In one embodiment, a method for processing a substrate is provided. The method comprises depositing a first barrier film on a substrate, wherein the first barrier film is a first material selected from the group consisting of a nitrogen doped silicon carbide film, an oxygen doped silicon carbide film, and a phenyl doped silicon carbide film. A second barrier film is deposited on the first barrier film. The second barrier film is a second material selected from the group consisting of an oxygen doped silicon carbide film, a nitrogen doped silicon carbide film, and a phenyl doped silicon carbide film. The second material is different from the first material. The second barrier film and the first barrier film form a bilayer barrier film. A dielectric layer having a dielectric constant of less than about 3 is deposited on the second barrier film of the bilayer barrier film. The dielectric layer is then cured with an electron beam or UV technique.

In one aspect, embodiments of the invention provide a method for depositing a nitrogen doped silicon carbide film on a substrate, depositing an oxygen doped silicon carbide film on the nitrogen doped silicon carbide film to form a bilayer barrier film comprising the nitrogen doped silicon carbide film and the oxygen doped silicon carbide film, depositing a dielectric layer having a dielectric constant of less than about 3 on the bilayer barrier film, and curing the dielectric layer with an ultraviolet (UV) curing technique.

In another aspect, embodiments of the invention provide a method for depositing a nitrogen doped silicon carbide film on a substrate, depositing an oxygen doped silicon carbide film on the nitrogen doped silicon carbide film to form a bilayer barrier film comprising the nitrogen doped silicon carbide film and the oxygen doped silicon carbide film, depositing a dielectric layer having a dielectric constant of less than about 3 on the bilayer barrier film, and curing the dielectric layer with an electron beam technique.

BRIEF DESCRIPTION OF THE DRAWINGS

So that the manner in which the above aspects of the invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION

Embodiments of the invention provide methods that comprise depositing a first barrier film on a substrate, depositing a second barrier film on the first barrier film, depositing a dielectric layer on the bilayer barrier film formed by the first barrier film and the second barrier film, and then curing the dielectric layer with a UV technique or an electron beam (e-beam) technique. The first barrier film may be a first film selected from the group of a nitrogen doped silicon carbide film, an oxygen doped silicon carbide film, and a phenyl doped silicon carbide film, and the second barrier film may be a second film selected from the group of an oxygen doped silicon carbide film, a nitrogen doped silicon carbide film, and a phenyl doped silicon carbide film, wherein the second film is different from the first film.

The words and phrases used herein should be given their ordinary and customary meaning in the art by one skilled in the art unless otherwise further defined. The following deposition processes are described with use of the 300 mm PRODUCER® dual deposition station processing chamber commercially available from Applied Materials, Inc. of Santa Clara, Calif., and should be interpreted accordingly where appropriate. For example, flow rates for the PRODUCER® processing chamber are total flow rates and should be divided by two to describe the process flow rates at each deposition station in the processing chamber. Additionally, it should be noted that the respective parameters may be modified to perform the plasma processes in various chambers and for different substrate sizes, such as for 200 mm substrates. Process parameters for electron beam treatment may occur in the PRODUCER® processing chamber or a separate chamber or separate system.

Deposition of Dual Layers for a Dual Damascene Structure

The bilayer described herein may be used as a barrier layer, etch stop, and/or anti-reflective coating/passivation layer in damascene formation, of which use as a barrier layer is preferred. Interlayer dielectric layers for use in low k damascene formations may contain silicon, carbon, and nitrogen or oxygen. An example of the adjacent interlayer dielectric layers for use with the bilayer barrier film described herein includes a low k carbon doped silicon oxide layer having a carbon content of about 1 atomic percent or greater excluding hydrogen atoms, preferably between about 5 and about 30 atomic percent excluding hydrogen atoms, and having an oxygen concentration of about 15 atomic % or greater and a dielectric constant of about 3 or less. Oxygen doped silicon carbide layers have oxygen concentrations of less than about 15 atomic % oxygen. Barrier layer materials may have dielectric constants of up to about 7, and preferably between about 2.5 and about 4.

The embodiments described herein for depositing silicon carbide layers adjacent low k dielectric layers are provided to illustrate the invention, and the particular embodiments shown should not be used to limit the scope of the invention.

Figure 1:
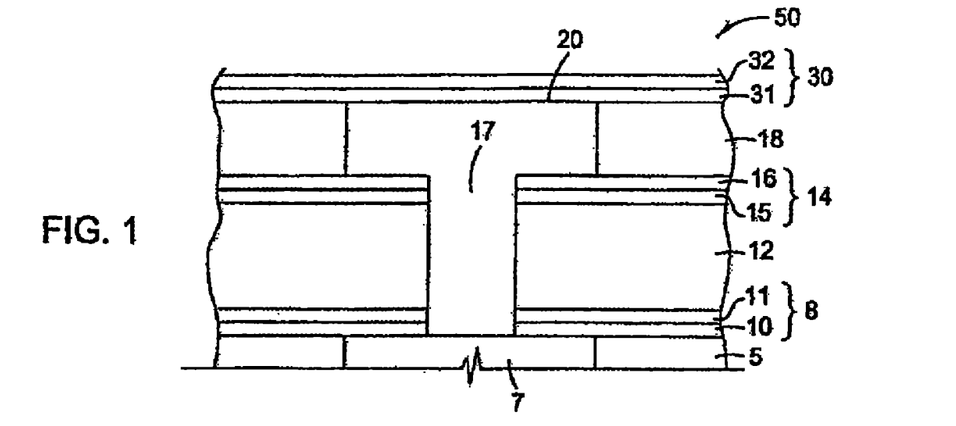
FIG. 1 is a cross sectional view showing a dual damascene structure comprising a bilayer barrier film and a low k dielectric layer according to embodiments of the invention.

An example of a damascene structure 50 that is formed with the bilayer described herein as a barrier layer is shown in FIG. 1. A substrate having conductive material features 7, such as copper features, formed in a substrate material 5, such as a dielectric material, is provided to a processing chamber. A bilayer 8 is deposited on the substrate. The bilayer may have a thickness of about 500 Å, for example. The first layer 10 of the bilayer 8 may comprise, for example, a nitrogen doped silicon carbide. The first layer 10 may be then be treated with an ultraviolet (UV) curing or an e-beam treatment. A second layer 11 of the bilayer 8 may comprise, for example, an oxygen doped silicon carbide and is deposited on the first bilayer 10. The second layer 11 may be then be annealed or cured with ultraviolet (UV) or e-beam radiation. The bilayer 8 is believed to provide improved barrier properties over a single barrier layer.

While first layer 10 of the bilayer 8 has been described above as a nitrogen doped silicon carbide film, and the second layer 11 of the bilayer 8 has been described above as an oxygen doped silicon carbide film, other films may be used to form the bilayer. Generally, the first layer may be a first film selected from the group consisting of an oxygen doped silicon carbide film, a nitrogen doped silicon carbide film, and a phenyl doped silicon carbide film, and the second layer may be a second, different film selected from the group consisting of an oxygen doped silicon carbide film, a nitrogen doped silicon carbide film, and a phenyl doped silicon carbide film. For example, the first layer 10 may be an oxygen doped silicon carbide film, and the second layer 11 may be a nitrogen doped or phenyl doped silicon carbide film. However, using a nitrogen doped or phenyl doped silicon carbide film as the first layer 110 is desirable in one aspect as the nitrogen doped or phenyl doped silicon carbide films either contain no oxygen or less oxygen than an oxygen doped silicon carbide film, which may contaminate the underlying conductive feature 7, e.g., copper, with oxygen.

In another embodiment, the bilayer 8 provides a first layer 10, such as oxygen doped silicon carbide film, which has a greater extinction coefficient than the second layer 11, but has a lower Si—H content, which maintains the compressive stress within the film stack. An opaque second layer 11 with low UV transmittance, such as a nitrogen doped silicon carbide film or a phenyl doped silicon carbide film, mitigates the effect of UV radiation on film stack stress and acts as a primary etch stop layer. The second layer 11 may have a dielectric constant more than the first layer 10, and the second layer 11 may also have less etch selectivity to the underlying dielectric material than the first layer 10. It is believed that the bilayers provide better hermeticity, lower dielectric constants, improved etch selectivity, and reduced photoresist poisoning as compared to a single layer. For example, the oxygen doped silicon carbide film provides a lower change in stress after exposure to a UV curing treatment (relative to a nitrogen doped or phenyl doped silicon carbide), while the nitrogen doped or phenyl doped silicon carbide film provides an improved etch selectivity (relative to an oxygen doped silicon carbide film) and a very low UV transmittance, which helps protect underlying layers from modification by UV exposure.

A dielectric layer 12 is then deposited on the second layer 11 of the bilayer 8. The dielectric layer 12 is treated with UV curing or an e-beam treatment. The treatment of the dielectric layer 12 may also result in the treatment of the underlying bilayer 8. The UV curing or e-beam treatment may remove a porogen from the dielectric layer 12, lower the dielectric constant of the dielectric layer, and/or improve the mechanical properties of the layer. For example, the dielectric layer 12 may be a layer that is deposited from a mixture comprising an organic porogen and a silicon precursor, resulting in the layer comprising the porogen and a silicon matrix. The UV curing or e-beam treatment removes the porogen, creating voids or pores in the layer that result in a lower dielectric constant of the layer.

A second bilayer 14, containing individual layers 15 and 16 similar in composition to layers 10 and 11, respectively, is then deposited on the first dielectric layer 12. The second bilayer 14 is then pattern etched to define the openings of the interconnects or contacts/vias 17. A second dielectric layer 18 is then deposited over the patterned bilayer, and may be treated with UV curing or an e-beam treatment. A single etch process is then performed to define the contact/vias 17 to etch the unprotected dielectric exposed by the patterned etch stop to define the contacts/vias 17. One or more conductive materials such as copper are then deposited to fill the formed contacts/vias 17, forming an interconnect 20. A third bilayer 30, containing individual layers 31 and 32 similar in composition to layers 15 and 16, respectively, is then deposited on the first dielectric layer 18.

A preferred dual damascene structure fabricated in accordance with the invention including bilayers deposited by the processes described herein is sequentially depicted schematically in FIGS. 2A-2H.

Figure 2A:
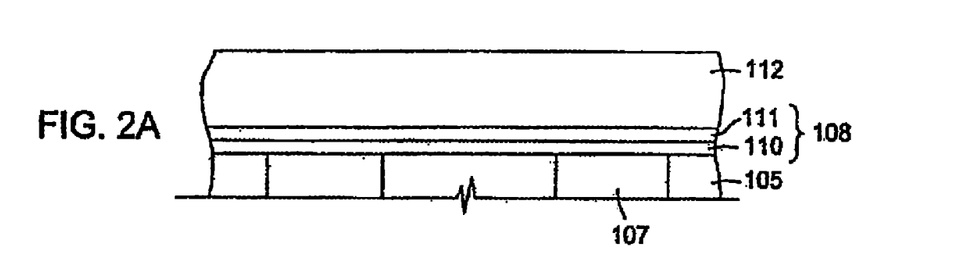
FIGS. 2A-2H are cross sectional views of structures showing one embodiment of a dual damascene deposition sequence.

In FIG. 2A, a damascene structure is formed using a substrate having conductive material features 107 formed in a substrate material 105, such as a dielectric material, silicon, or non-metal conductive material, such as polysilicon or doped silicon. The conductive materials are typically metal, including metal barrier materials, such as titanium, titanium nitride, tantalum, tantalum nitride, or combinations thereof, and fill materials, such as copper aluminum, or tungsten, for example.

The bilayer 108 may comprise a first layer 110 of a nitrogen doped silicon carbide film and may be deposited on the substrate surface using the processes described herein. The first layer 110 may be deposited to a thickness between about 100 Å and about 1000 Å.

The nitrogen doped silicon carbide film may be deposited by introducing ammonia at a flow rate of 700 sccm into a processing chamber, introducing helium at a flow rate of 1200 sccm into the processing chamber, introducing trimethylsilane at a flow rate of about 350 sccm, maintaining the chamber at a substrate heater temperature of about 350° C., maintaining a chamber pressure of about 3.7 Torr, positioning a gas distributor at about 280 mils from the substrate surface, and applying a RF power of about 900 watts at 13.56 MHz, to deposit a nitrogen doped silicon carbide film. The nitrogen doped silicon carbide film may be deposited at about 1800 Å/min by this process to a thickness of about 1000 Å. The deposited nitrogen doped silicon carbide film may have a dielectric constant of about 5. The nitrogen doped silicon carbide material and any post-treatment process may be formed in the same processing chamber or same processing system without breaking vacuum.

Another example of a nitrogen doped silicon carbide deposition process comprises introducing ammonia at a flow rate of 1000 sccm into a processing chamber, introducing helium at a flow rate of 1500 sccm into the processing chamber, introducing trimethylphenylsilane at a flow rate of about 200 sccm, introducing ethylene ($C_2H_4$) at a flow rate of about 600 sccm, maintaining the chamber at a substrate heater temperature of about 350° C., maintaining a chamber pressure of about 6 Torr, positioning a gas distributor at about 450 mils from the substrate surface, and applying a RF power of about 200 watts at 13.56 MHz, to deposit a nitrogen doped silicon carbide film. The nitrogen doped silicon carbide film may be deposited at about 1250 Å/min by this process to a thickness of about 500 Å. The deposited nitrogen doped silicon carbide film has a dielectric constant of about 3 to about 4.

An example of a phenyl doped silicon carbide deposition process comprises introducing hydrogen at a flow rate of 500 sccm into a processing chamber, introducing helium at a flow rate of 1500 sccm into the processing chamber, introducing dimethylphenylsilane (DMPS) at a flow rate of about 750 sccm, maintaining the chamber at a substrate heater temperature of about 350° C., maintaining a chamber pressure of about 6 Torr, positioning a gas distributor at about 450 mils from the substrate surface, and applying a RF power of about 200 watts at 13.56 MHz, to deposit a phenyl doped silicon carbide film. The phenyl doped silicon carbide film may be deposited at about 1250 Å/min by this process to a thickness of about 500 Å. The deposited silicon carbide layer has a dielectric constant of about 3 to about 4.

A second layer 111, which may be an oxygen doped silicon carbide film, is deposited on the first layer 110. An example of a oxygen doped silicon carbide deposition process comprises introducing carbon dioxide at a flow rate of 700 sccm into a processing chamber, introducing helium at a flow rate of 400 sccm into the processing chamber, introducing trimethylsilane (TMS) at a flow rate of about 160 sccm, maintaining the chamber at a substrate heater temperature of about 350° C., maintaining a chamber pressure of about 2.5 Torr, positioning a gas distributor at about 320 mils from the substrate surface, and applying a RF power of about 200 watts at 13.56 MHz, to deposit an oxygen doped silicon carbide film. The oxygen doped silicon carbide film may be deposited at about 900 Å/min by this process to a thickness of about 500 Å. The deposited oxygen doped silicon carbide film has a dielectric constant of about 3.5 to about 4.6.

Returning to FIG. 2A, the first dielectric layer 112 of interlayer dielectric material is deposited on the bilayer 108. The first dielectric layer 112 may comprise a carbon doped silicon oxide, such as a porous carbon doped silicon oxide, and may be deposited by oxidizing an organosilane or organosiloxane, such as trimethylsilane, or reacting an organosilicon compound with a porogen.

An example of a dielectric layer comprising carbon doped silicon oxide having a dielectric constant of less than about 3 is Black Diamond™ dielectric material, developed by Applied Materials, Inc., of Santa Clara, Calif. Alternatively, the first dielectric layer may comprise other low k dielectric materials such as low k polymer materials including paralyne or a low k spin-on glass such as un-doped silicon glass (USG) or fluorine-doped silicon glass (FSG). The first dielectric layer 112 may be deposited to a thickness of about 5,000 Å to about 15,000 Å, depending on the size of the structure to be fabricated. The dielectric layer is then post deposition treated with UV or e-beam curing.

Figure 2B:
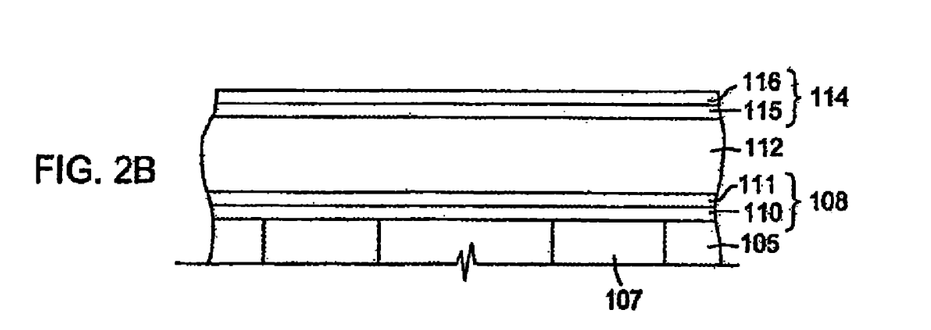

FIG. 2B shows the features of FIG. 2A with an additional bilayer 114 deposited on the dielectric layer 112. The bilayer 114 comprises the same materials as bilayer 108 described herein. For example, the first layer 115 may comprise a nitrogen doped silicon carbide film, and a second layer 116 may comprise an oxygen doped silicon carbide film. The additional bilayer may be deposited to a thickness of about 500 Å.

Figure 2C:
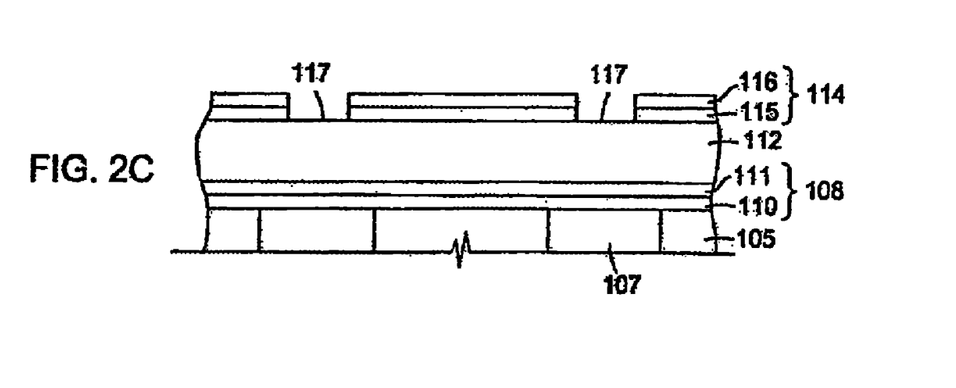

The bilayer may then be pattern etched to define the contact/via feature definition openings 117 and to expose first dielectric layer 112 in the areas where the contacts/vias are to be formed as shown in FIG. 2C. Preferably, the bilayer 114 is pattern etched using conventional photolithography and etch processes using fluorine, carbon, and oxygen ions.

Figure 2D:
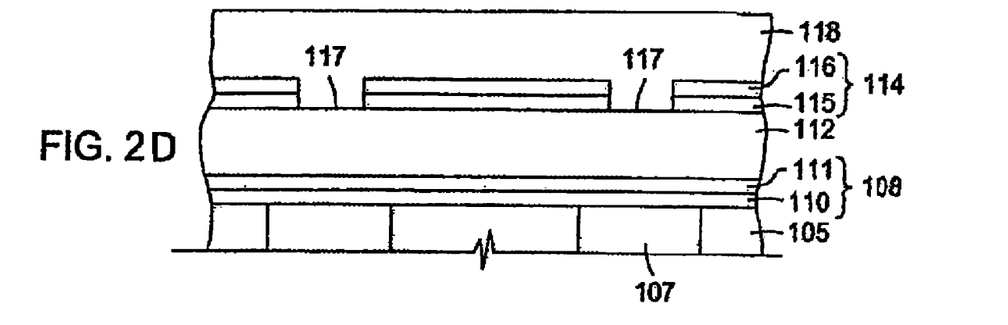

After the bilayer 114 has been etched to pattern the contacts/vias, a second dielectric layer 118 is deposited as shown in FIG. 2D. The second dielectric layer 118 may be deposited as described for the first dielectric layer 112 as well as comprise the same materials used for the first dielectric layer 112. The first dielectric layer 112 and second dielectric layer 118 may also be post-deposition treated with UV curing or electron beam treatment. All of the described layers 108, 110, 111, 112, 114, 115, 116, and 118 may be deposited in the same processing chamber or same processing system without breaking vacuum.

Figure 2E:
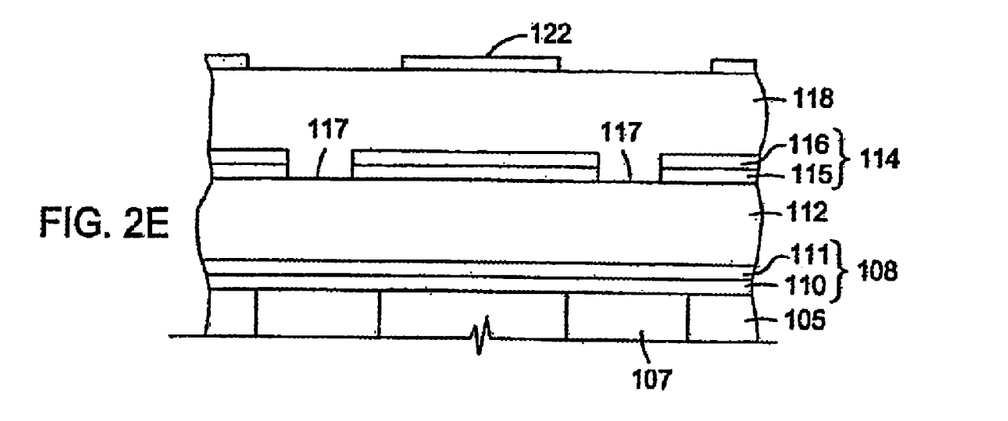
Figure 2F:
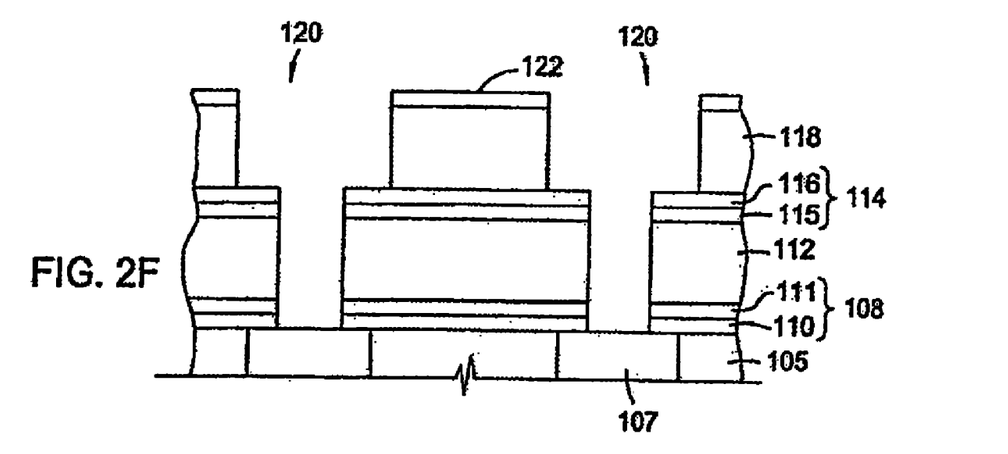

A resist material 122 is then deposited on the second dielectric layer 118 and patterned preferably using conventional photolithography processes to define the interconnect lines 120 as shown in FIG. 2E. The resist material 122 comprises a material conventionally known in the art, preferably a high activation energy resist, such as UV-5, commercially available from Shipley Company, Inc., of Marlborough, Mass. The interconnects and contacts/vias are then etched using reactive ion etching or other anisotropic etching techniques to define the metallization structure (i.e., the interconnect and contact/via) as shown in FIG. 2F. Any resist or other material used to pattern the etch stop 114 or the second dielectric layer 118 is removed using an oxygen strip or other suitable process.

Figure 2G:
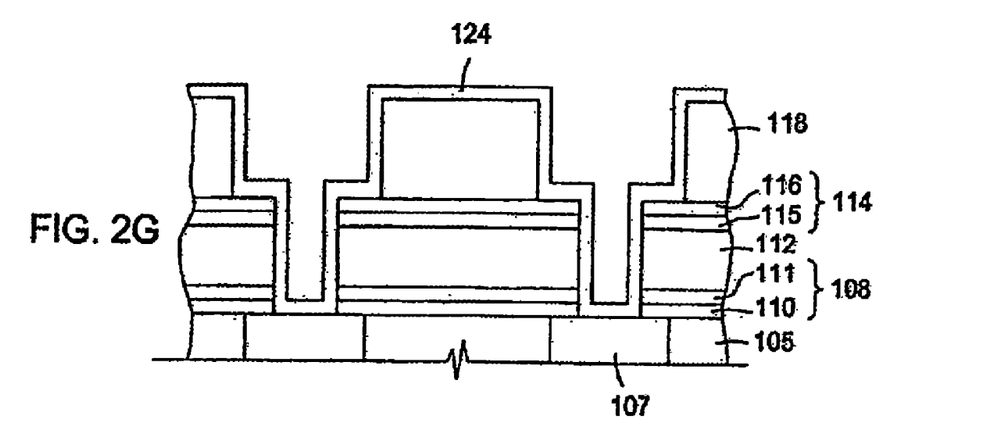

The metallization structure is then formed with a conductive material such as aluminum, copper, tungsten or combinations thereof. Presently, the trend is to use copper to form the smaller features due to the low resistivity of copper (1.7 mΩ-cm compared to 3.1 mΩ-cm for aluminum). Preferably, as shown in FIG. 2G, a suitable barrier layer 124 for copper, such as tantalum or tantalum nitride, is first deposited conformally in the metallization pattern to prevent copper migration into the surrounding silicon and/or dielectric material. Thereafter, copper 126 is deposited using chemical vapor deposition, physical vapor deposition, electroplating, or combinations thereof to form the conductive structure. A seed layer of a conductive material, such as copper, may be deposited for bulk fill of the feature definition by the copper 126. Once the structure has been filled with copper or other metal, the surface is planarized using chemical mechanical polishing, as shown in FIG. 2H.

Figure 2H:
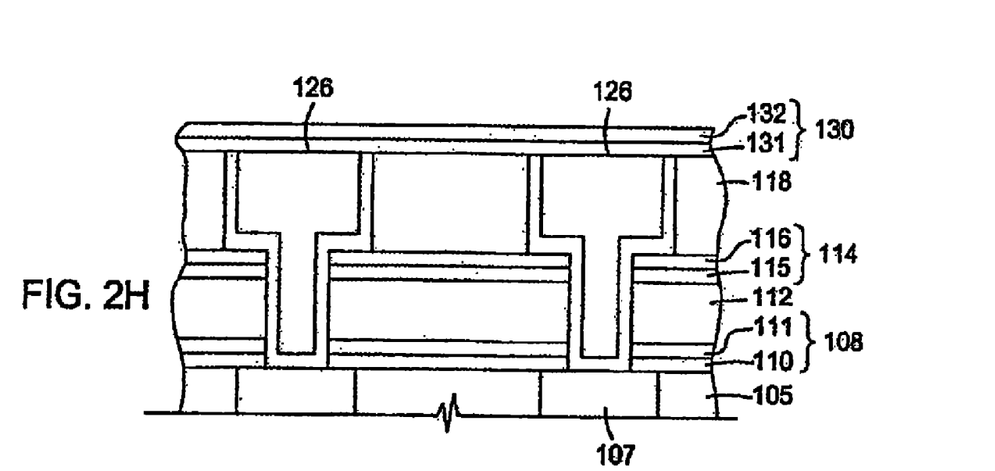

FIG. 2H also shows an additional bilayer 130 deposited on the second dielectric layer 118 and the planarized copper. The bilayer 130 may comprise the same materials as bilayer 108. For example, the first layer 131 of the bilayer 130 may comprise a nitrogen doped silicon carbide film, and a second layer 132 of the bilayer 130 may comprise an oxygen doped silicon carbide film. The additional bilayer may be deposited to a thickness of about 500 Å.

Further description of the deposition of a bilayer for a dual damascene structure is provided in U.S. patent application Ser. No. 11/123,265, filed May 5, 2005, now published as U.S. Patent Publication No. 2005/0250346, and in U.S. Pat. No. 7,091,137, issued on Aug. 15, 2006, both of which are herein incorporated by reference. Examples of methods and uses for the adjacent dielectric layers comprising silicon, oxygen, and carbon, having a dielectric constant of less than about 3 are more further described in U.S. Pat. No. 6,054,379, issued May 25, 2000, U.S. Pat. No. 6,287,990, issued Sep. 11, 2001, and U.S. Pat. No. 6,303,523, issued on Oct. 16, 2001, and in U.S. patent application Ser. No. 10/121,284, filed on Apr. 11, 2002, and U.S. patent application Ser. No. 10/302, 393, filed on Nov. 22, 2002, and U.S. patent application Ser. No. 10/888,110, filed on Jul. 9, 2004, all of which are incorporated by reference herein to the extent not inconsistent with the disclosure and claimed aspects described herein.

UV Curing

In one aspect of the invention, the deposited bilayer and dielectric layer material may be cured by an UV curing process. Silicon carbide materials cured using the UV curing process has shown improved barrier layer properties and reduced and minimal stress change. The UV curing process may be performed in situ within the same processing chamber or system, for example, transferred from one chamber to another without break in a vacuum. Ultraviolet curing is commonly performed in the NanoCure™ chamber, available from Applied Materials, Inc., of Santa Clara, Calif. The following UV curing process is illustrative, and should not be construed or interpreted as limiting the scope of the invention.

Exposure to an UV radiation source may be performed as follows. The substrate is introduced into a NanoCure™ chamber, which may include a deposited film stack, including nitrogen doped silicon carbide materials, is exposed to between about 0.01 milliWatts/cm$^2$ and about 1 watts/cm$^2$ of UV radiation, for example, between about 0.1 milliWatts/cm$^2$ and about 10 milliwatts/cm$^2$. The UV radiation may comprise a range of UV wavelengths and include one or more simultaneous wavelengths. Suitable UV wavelengths include between about 1 nm and about 400 nm, and may further include optical wavelengths up to about 600 or 780 nm. The UV wavelengths between about 1 nm and about 400 nm, may provide a photon energy (electroVolts) between about 11.48 (eV) and about 3.5 (eV). Preferred UV wavelengths include between about 100 nm and about 350 nm.

Further, the UV radiation application may occur at multiple wavelengths, a tunable wavelength emission and tunable power emission, or a modulation between a plurality of wavelengths as desired, and may be emitted from a single UV lamp or applied from an array of UV lamps. Examples of suitable UV lamps include a Xe filled Zeridex™ UV lamp, which emits UV radiation at a wavelength of about 172 nm or the Ushio Excimer UV lamp, or a Hg Arc Lamp, which emits UV radiation at wave. The deposited silicon carbide films may be exposed to the UV radiation for between about 10 seconds and about 600 seconds.

During processing, the temperature of the processing chamber may be maintained at between about 0° C. and about 450° C., for example, between about 20° C. and about 400° C. degrees Celsius, for example about 25° C., and at a chamber pressure between vacuum, for example, less than about 1 mTorr up to about atmospheric pressure, i.e., 760 Torr, for example at about 100 Torr. The source of UV radiation may be between about 100 mils and about 600 mils from the substrate surface. Optionally, a processing gas may be introduced during the UV curing process. Suitable processing gases include oxygen ($O_2$), nitrogen ($N_2$), hydrogen ($H_2$), helium (He), argon (Ar), water vapor ($H_2O$), carbon monoxide, carbon dioxide, hydrocarbon gases, fluorocarbon gases, and fluorinated hydrocarbon gases, or combinations thereof. The hydrocarbon compounds may have the formula $C_XH_Y$, $C_XF_Y$, $C_XF_YH_Z$, or combinations thereof, with x being an integer between 1 and 6, y being an integer between 4 and 14, and z being an integer between 1 and 3.

An example of an UV process is as follows. A substrate having a nitrogen doped silicon carbide layer is exposed to UV radiation at a chamber temperature of about 400° C. and applied power of about 10 mW/cm² at a wavelength of about 172 nm for about 960 seconds. The curing is conducted in an argon atmosphere with an argon flow of 16000 sccm, ozone flow of 4900 sccm and pressure of 4 torr.

A serious issue with film stacks that require UV curing is the transmittance of UV energy to underlying layers, such as inter-level dielectric (ILD) layers, which in turn may be modified by UV exposure. Another major concern after UV exposure is the change in dielectric barrier film stress from compressive to neutral or even tensile, mitigating the stress clamping effect and comprising overall mechanical integrity of the semiconductor device. For example, nitrogen doped silicon carbide films used in damascene applications typically exhibit an as-deposited compressive stress of about −200 MPa. After UV curing, these films exhibit a tensile stress of 600 MPa. In another example, a layer of dielectric material was deposited to a thickness of 5000 Å on a layer of nitrogen doped silicon carbide having a thickness of 500 Å, and the stack underwent UV curing. The change in stress in the nitrogen doped silicon carbide layer was 854 MPa. The change in the film stack stress was 80 MPa, and the final stack stress (tensile) was 100 MPa.

In an example according to an embodiment of the invention, the stress of film stacks comprising 500 Å of a low dielectric constant material on a 500 Å bilayer comprising a phenyl doped silicon carbide film on top of an oxygen doped silicon carbide film was measured after UV treatment. For film stacks in which 20% of the bilayer was formed by the oxygen doped silicon carbide, the post UV treatment film stack stress was about 10 MPa (tensile). For film stacks in which 40% of the bilayer was formed by the oxygen doped silicon carbide, the post UV treatment film stack stress was about −40 MPa (compressive). In comparison, film stacks which included only a 500 Å of a low dielectric constant material on a 500 Å monolayer of a phenyl doped silicon carbide film without an additional oxygen doped silicon carbide film had a film stack stress of about 70 MPa (tensile).

Electron Beam Treatment

In one aspect of the invention, the deposited bilayer and dielectric layer material may be cured by an electronic beam (e-beam) technique. Silicon carbide material cured using an e-beam technique has shown an unexpected reduction in k value, and an unexpected increase in hardness, and the least amount of change in barrier film stress, not capable with conventional curing techniques. Unlike UV curing, the penetration depth of electrons can be controlled thereby limiting penetration into underlying dielectric layers. Since there is limited penetration of electrons beyond the film, there is minimal change in overall barrier film stress and consequently the stress clamping effect can be maintained with any dielectric barrier films. The e-beam treatment may be performed in situ within the same processing system, for example, transferred from one chamber to another without break in a vacuum. The following e-beam apparatus and process are illustrative, and should not be construed or interpreted as limiting the scope of the invention.

The temperature at which the electron beam apparatus 200 operates ranges from about 200 degrees Celsius to about 600 degrees Celsius, for example, about 400 degrees Celsius. An e-beam treatment of a silicon carbide film may comprise the application or exposure to between about 1 micro coulombs per square centimeter (μC/cm²) and about 6,000 μC/cm², for example, between about 1 μC/cm² and about 400 μC/cm², and more preferably less than about 200 μC/cm², such as about 70 μC/cm², at energy ranges between about 0.5 kiloelectron volts (KeV) and about 30 KeV, for example between about 1 KeV and about 3 kiloelectron volts (KeV). The electron beams are generally generated at a pressure of about 1 mTorr to about 200 mTorr. The time of exposure will generally range from 0.5 minutes to 10 minutes, and preferably from 2 minutes to 4 minutes.

The gas ambient in the electron beam chamber may be an inert gas, including nitrogen, helium, argon, xenon, an oxidizing gas including oxygen, a reducing gas including hydrogen, a blend of hydrogen and nitrogen, ammonia, or any combination of these gases. The electron beam current ranges from about 1 mA to about 40 mA, and more preferably from about 5 mA to about 20 mA. The electron beam may cover an area from about 4 square inches to about 700 square inches. Although any e-beam device may be used, one exemplary device is the EBK chamber, available from Applied Materials, Inc., of Santa Clara Calif.

A general example of an e-beam process is as follows. A substrate having a 500 Å thick bilayer is exposed to an e-beam at a chamber temperature about 400 degrees Celsius, an applied electron beam energy of about 3.5 KeV, and at an electron beam current of about 5 mA, with an exposure dose of the electron beam of about 500 mC/cm².

In another example, a layer of dielectric material was deposited to a thickness of 5000 Å on a layer of nitrogen doped silicon carbide having a thickness of 500 Å, and the stack underwent electron beam treatment. The change in stress in the nitrogen doped silicon carbide layer was 195 MPa. The change in the film stack stress was 24 MPa, and the final stack stress (tensile) was 40 MPa.

Further description of an e-beam process for silicon carbon materials is more fully provided in U.S. Pat. No. 6,790,788, issued on Sep. 14, 2004, U.S. Pat. No. 6,582,777, issued on Jun. 24, 2003, and U.S. Pat. No. 5,003,178, issued on Mar. 26, 1991, which are incorporated herein by reference.

While the foregoing is directed to preferred embodiments of the present invention, other and further embodiments of the invention may be devised without departing from the basic scope thereof, and the scope thereof is determined by the claims that follow.

What is claimed is:

1. A method for processing a substrate, comprising: depositing a first barrier film on a substrate, wherein the first barrier film is a first material comprising a nitrogen doped silicon carbide film; depositing a second barrier film on the first barrier film, wherein the second barrier film is a second material comprising a nitrogen, doped silicon carbide film and is different from the first material, and the second barrier film and the first barrier film form a bilayer barrier film; depositing a dielectric layer having a dielectric constant of less than about 3 on the second barrier film; and curing the dielectric layer using a UV technique, and UV transmittance through the second barrier film is less than UV transmittance through the first barrier film.

2. The method of claim 1, wherein the curing comprises exposing the dielectric layer to a radiation dose between about 0.01 milliWatts/cm² and about 1 Watts/cm² at wavelengths between about 1 nm at about 400 nm.

3. The method of claim 1, wherein curing the dielectric layer removes a porogen from the dielectric layer.

4. The method of claim 1, wherein the dielectric constant of the second nitrogen doped silicon carbide film is greater than the dielectric constant of the first nitrogen doped silicon carbide film.

5. A method for processing a substrate, comprising:
depositing a first nitrogen doped silicon carbide film on a substrate;

depositing an second nitrogen doped silicon carbide film on the first nitrogen doped silicon carbide film to form a bilayer barrier, wherein the second nitrogen doped silicon carbide film is different from the first nitrogen doped silicon carbide film;

depositing a dielectric layer having a dielectric constant of less than about 3 on the oxygen doped silicon carbide film; and curing the dielectric layer with an UV technique, wherein the curing comprises exposing the dielectric layer to a radiation dose between about 0.01 milliWatts/cm$^2$ and about 1 watts/cm$^2$ at wavelengths between about 1 nm and about 400 nm, and heating the substrate to a temperature of from about 20° C. to about 400° C. at a pressure of about 1 mTorr to about 760 Torr.

6. The method of claim 5, wherein the curing comprises exposing the substrate to a gas selected from the group consisting of nitrogen, helium, argon, xenon, oxygen, hydrogen, ammonia, and combinations thereof.

7. A method for processing a substrate, comprising:

depositing a first nitrogen doped silicon carbide film on a substrate;

depositing an second nitrogen doped silicon carbide film on the first nitrogen doped silicon carbide film to form a bilayer barrier film, wherein the second nitrogen doped silicon carbide film is different from the first nitrogen doped silicon carbide film;

depositing a dielectric layer having a dielectric constant of less than about 3 on the oxygen doped silicon carbide film; and curing the dielectric layer with an electron beam technique, wherein the electron beam treatment comprises exposing the dielectric layer for about 0.5 minutes to about 10 minutes at an energy level ranging from about 0.5 to about 30 keV.

8. The method of claim 7, wherein the electron beam treatment comprises exposing the dielectric layer to an electron beam from a source which generates an electron dose between about 1 and 6,000 μC/cm$^2$ at a current between 1 and 40 mA.

9. The method of claim 8, wherein the electron beam treatment comprises heating the substrate to a temperature of from about 10° C. to about 400° C. at a pressure of about 1 mTorr to about 200 mTorr.

10. The method of claim 9, wherein the electron beam treatment comprises exposing the substrate to a gas selected from the group consisting of nitrogen, helium, argon, xenon, oxygen, hydrogen, ammonia, and combinations thereof.

11. The method of claim 10, wherein the electron beam treatment comprises exposing the dielectric layer with a wide, large beam of electron beam radiation from a uniform large-area electron beam source which covers an area of from about 4 square inches to about 700 square inches.

\* \* \* \* \*

UNITED STATES PATENT AND TRADEMARK OFFICE
CERTIFICATE OF CORRECTION

| | | |
|---|---|---|
| PATENT NO. | : 7,851,384 B2 | Page 1 of 1 |
| APPLICATION NO. | : 11/751516 | |
| DATED | : December 14, 2010 | |
| INVENTOR(S) | : Liu et al. | |

It is certified that error appears in the above-identified patent and that said Letters Patent is hereby corrected as shown below:

In the Claims:

Column 10, Claim 1, Line 47, please delete "," after nitrogen.

Signed and Sealed this
Eighth Day of March, 2011

David J. Kappos
*Director of the United States Patent and Trademark Office*